United States Patent
Miyagawa et al.

(10) Patent No.: US 10,093,856 B2
(45) Date of Patent: Oct. 9, 2018

(54) PHOSPHOR CERAMIC ELEMENT

(71) Applicant: NITTO DENKO CORPORATION, Osaka (JP)

(72) Inventors: Hiroaki Miyagawa, Oceanside, CA (US); Ekambaram Sambandan, Carlsbad, CA (US); Bin Zhang, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 163 days.

(21) Appl. No.: 15/177,212

(22) Filed: Jun. 8, 2016

(65) Prior Publication Data

US 2016/0355732 A1  Dec. 8, 2016

Related U.S. Application Data

(60) Provisional application No. 62/172,703, filed on Jun. 8, 2015.

(51) Int. Cl.
*C09K 11/77* (2006.01)
*C04B 35/50* (2006.01)
(Continued)

(52) U.S. Cl.
CPC .......... *C09K 11/7774* (2013.01); *C04B 35/44* (2013.01); *C04B 35/634* (2013.01); *C04B 35/638* (2013.01); *C04B 2235/3224* (2013.01); *C04B 2235/3229* (2013.01); *C04B 2235/3262* (2013.01); *C04B 2235/3418* (2013.01); *C04B 2235/6025* (2013.01); *C04B 2235/6562* (2013.01); *C04B 2235/6565* (2013.01); *C04B 2235/6567* (2013.01); *C04B 2235/6581* (2013.01); *C04B 2235/6586* (2013.01); *C04B 2235/661* (2013.01); *C04B 2235/663* (2013.01); *C04B 2235/664* (2013.01); *C04B 2235/764* (2013.01); *C04B 2235/9646* (2013.01); *C04B 2235/9653* (2013.01); *H01L 33/502* (2013.01)

(58) Field of Classification Search
CPC ............ C09K 11/7774; C09K 11/7721; C09K 11/025; C09K 11/57; C09K 11/617; C04B 2235/6581; C04B 2235/764; C04B 2235/652; C04B 2235/661; C04B 2235/663; C04B 2235/664; C04B 35/64; C04B 35/50; H01L 33/505; H01L 33/502
USPC ........................ 252/301.4 F, 301.4 R; 264/21
See application file for complete search history.

(56) References Cited

U.S. PATENT DOCUMENTS 8,871,114 B2 * 10/2014 Miyagawa ......... C09K 11/7774
252/301.4 F
9,567,518 B2 * 2/2017 Miyagawa
2013/0069007 A1 * 3/2013 Miyagawa ......... C09K 11/7774
252/301.6 R

OTHER PUBLICATIONS

Jia et al., "Color Point Tuning in Lu3-x-yMnxAl5-xSixO12:yCe", Jul. 6, 2012, ChemPhysChem Articles, vol. 13, pp. 3383-3387.*

* cited by examiner

*Primary Examiner* — Matthew E Hoban
*Assistant Examiner* — Lynne Edmondson
(74) *Attorney, Agent, or Firm* — K&L Gates LLP; Louis C. Cullman; Robert W. Winn

(57) ABSTRACT

A garnet ceramic phosphor with Ce and Mn co-doping, wherein calcium and silicon in the phosphor crystal host can be minimized for enhancing performance, is described herein. Also a ceramic phosphor element comprising a garnet phosphor having composition of formula 1 or 2 is described herein:

$(A_{1-x},Ce_x)_3(Al_{1-y},Mn_y)_{5-w}Si_wO_{12}$  (Formula 1)

$(Lu_{1-x},Ce_x)_3(Al_{1-y},Mn_y)_{5-w}Si_wO_{12}$  (Formula 2).

8 Claims, 8 Drawing Sheets

(51) Int. Cl.
    *C04B 35/64*     (2006.01)
    *C04B 35/44*     (2006.01)
    *C04B 35/634*    (2006.01)
    *C04B 35/638*    (2006.01)
    *H01L 33/50*     (2010.01)

PHOSPHOR CERAMIC ELEMENT

BACKGROUND

Field of Invention

The present embodiments relate to garnet phosphor ceramic plates suitable for lighting devices, more particularly to the use with blue and near-UV light sources.

Description of Related Art

Manganese (Mn) ions usually exhibit emission in the green or red region depending upon their crystalline structure and lattice position. However phosphor materials containing Mn ions suffer from low transparency and poor efficiency.

SUMMARY

Garnet materials, such as garnet phosphor compositions, including transparent or translucent ceramic plates or elements, may be useful for lighting applications. For example, they may be useful as wavelength conversion elements to convert bluish light to a warmer, or more red color. In particular, lutetium aluminum garnets (LuAG) may be useful to these ends. Some of these garnets may have reduced levels of Ca or Si. Dopants, such as cerium and manganese co-dopants, may also be useful. In particular, garnet crystals with low levels of silicon, and both cerium and manganese co-dopants may be useful.

Some embodiments include a ceramic phosphor element comprising a garnet phosphor composition having a formula:

$$(A_{1-x}Ce_x)_3(Al_{1-y}Mn_y)_5{}_{-w}Si_wO_{12} \quad \text{(Formula 1)}$$

wherein A is an element such as Y, Lu, or Gd, or

$$(Lu_{1-x}Ce_x)_3(Al_{1-y}Mn_y)_5{}_{-w}Si_wO_{12} \quad \text{(Formula 2)}$$

with respect to Formula 1 or 2, x is greater than 0 and less than about 0.2; y is greater than 0 and less than about 0.1; and w is greater than 0 and less than 0.455.

The present embodiments include a ceramic phosphor element comprising a garnet phosphor described by the following formula:

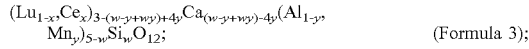

$$(Lu_{1-x}Ce_x)_{3-(w-y+wy)+4y}Ca_{(w-y+wy)-4y}(Al_{1-y},Mn_y)_{5-w}Si_wO_{12}; \quad \text{(Formula 3)}$$

wherein x is about 0-0.2, whereas y is about 0-0.1. Silicon can be minimized and calcium can be substantially eliminated so that w is about 5y/(1+y).

Some embodiments include a light emitting device outputting a warm-white light, comprising a ceramic phosphor element described herein, disposed with respect to a light source so that a portion of any light emitted from the light source is absorbed by the ceramic phosphor element, and wherein absorption of light from the light source by the ceramic phosphor element results in emission of red-shifted light by the ceramic phosphor element.

Some embodiments include a method for making a ceramic phosphor element comprising:
(a) Sintering/densifying a laminate at a temperature of about 1550° C. to about 1850° C.;
(b) Heating/reoxidizing the laminate to a temperature of about 1300° C. to about 1500° C. at a near vacuum with presence of small amount of oxygen; and
(c) further heating/annealing the laminate to a temperature of about 1200° C. to about 1500° C. under a reducing atmosphere;

wherein the laminate contains a precursor composition so that the ceramic phosphor element resulting from the method has a structure of Formula 1 or Formula 2.

These and other embodiments are described in greater detail below.

DETAILED DESCRIPTION

Figure 1:
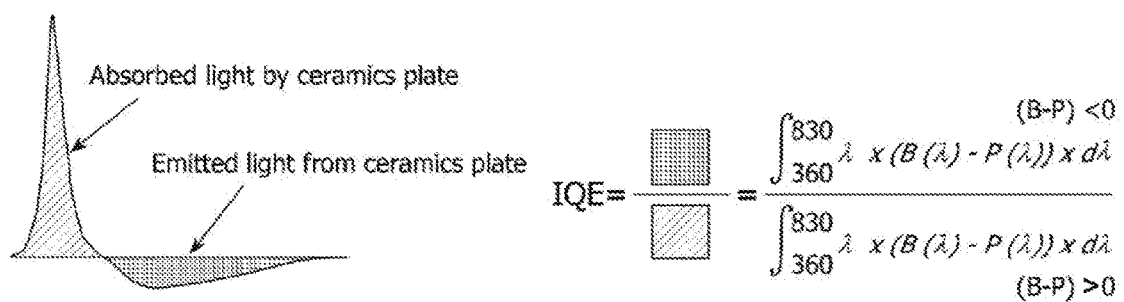
FIG. 1 is an explanation of how IQE of phosphorceramics is calculated.

With respect to any relevant structural representation, such as Formula 1 or Formula 2, x may be greater than 0 and less than about 0.2, about 0.0001-0.05, about 0.005-0.2, about 0.006-0.15, about 0.002-0.03, about 0.001-0.02, about 0.001-0.01, about 0.01-0.03, about 0.02-0.04, about 0.03-0.05, about 0.04-0.06, about 0.05-0.07, about 0.002, about 0.004, about 0.01, about 0.02, about 0.03, about 0.04, about 0.05, about 0.075, about 0.1, about 0.15, about 0.2, about 0.0025, about 0.005, or any number in a range bounded by any of these values.

With respect to any relevant structural representation, such as Formula 1 or Formula 2, y may be greater than 0 and less than about 0.1, about 0.0005-0.1, about 0.0005-0.2, about 0.03-0.3, about 0.032-0.28, about 0.001-0.1, about 0.001-0.005, about 0.005-0.01, about 0.005-0.05, about 0.005-0.015, about 0.01-0.03, about 0.02-0.04, about 0.03-0.05, about 0.05-0.1, about 0.00125, about 0.0025, about 0.005, about 0.0065, about 0.01, about 0.0146, about 0.015, about 0.02, about 0.03, about 0.032, or any number in a range bounded by any of these values.

With respect to any relevant structural representation, such as Formula 1 or Formula 2, w may be greater than 0 and less than about 0.455, less than 0.300, less than 0.250, less than 0.2, less than about 0.17, less than about 0.15, about 0.005-0.2, about 0.03-0.2, about 0.03-0.3, about 0.032-0.283, about 0.05-0.15, about 0.01-0.03, about 0.02-0.04, about 0.04-0.06, 0.05-0.07, about 0.07-0.1, about 0.1-0.2, about 0.2-0.3, about 0.03-0.07, about 0.03, about 0.032, about 0.05, about 0.074, about 0.75, about 0.098, about 0.1, about 0.146, about 0.15, or any number in a range bounded by any of these values.

In some embodiments, a ceramic phosphor element has an empirical formula: $Lu_{2.994}Ce_{0.006}Al_{4.936}Mn_{0.032}Si_{0.032}O_{12}$, $Lu_{2.994}Ce_{0.006}Al_{4.900}Mn_{0.050}Si_{0.050}O_{12}$, $Lu_{2.970}Ce_{0.030}Al_{4.900}Mn_{0.050}Si_{0.050}O_{12}$, $Lu_{2.940}Ce_{0.060}Al_{4.900}Mn_{0.050}Si_{0.050}O_{12}$, $Lu_{2.910}Ce_{0.090}Al_{4.900}Mn_{0.050}Si_{0.050}O_{12}$, $Lu_{2.910}Ce_{0.090}Al_{4.852}Mn_{0.074}Si_{0.074}O_{12}$, $Lu_{2.910}Ce_{0.090}Al_{4.708}Mn_{0.146}Si_{0.146}O_{12}$,
$Lu_{2.880}Ce_{0.120}Al_{4.9}Mn_{0.050}Si_{0.050}O_{12}$,
$Lu_{2.880}Ce_{0.120}Al_{4.804}Mn_{0.098}Si_{0.098}O_{12}$, or
$Lu_{2.850}Ce_{0.150}Al_{4.9}Mn_{0.050}Si_{0.050}O_{12}$.

In some embodiments, a ceramic phosphor element has an empirical formula: $Lu_{2.000}Ce_{0.005}Ca_{0.995}Al_{3.995}Mn_{0.005}Si_{1.000}O_{12}$; $Lu_{2.000}Ce_{0.010}Ca_{0.990}Al_{3.990}Mn_{0.010}Si_{1.000}O_{12}$; $Lu_{2.000}Ce_{0.020}Ca_{0.980}Al_{3.980}Mn_{0.020}Si_{1.000}O_{12}$; or $Lu_{1.995}Ce_{0.005}Ca_{1.000}Al_{4.000}Si_{1.000}O_{12}$ A ceramic phosphor element may be transparent, have a high transparency, or may be translucent. For example, a ceramic phosphor element may have a transmittance of least 20%, at least 25%, at least 40%, at least 60%, at least about 70%, at least 80%, or at least 85% for light having a wavelength of 800 nm.

A ceramic phosphor element having a transmittance above may have substantially no porosity, may be densified without porosity, or may have substantially no additional porosity. A ceramic phosphor element having no additional includes a ceramic phosphor element that is prepared without an additional step of increasing the porosity of the ceramic phosphor element, e.g., taking a step to include air voids within the ceramic element or dispersing within the ceramic phosphor element additional materials having a second index of refraction different from the ceramic element materials.

In some embodiments, pores may be introduced to the ceramic to decrease the transparency of the ceramic phosphor element to a desired transparency level, e.g., about 20% transparency. In some embodiments, the phosphor element has a transparency of at least about 85% without porosity. A suitable method for determining visible light transparency is disclosed in U.S. Pat. No. 8,169,136, which is incorporated by reference in its entirety for its disclosure of determining total light transmission %.

A ceramic phosphor element may have a high internal quantum efficiency (IQE), such as IQE of at least about 60%, at least about 70%, at least about 75%, at least about 80%, or at least about 85% based upon the absorption of light by the ceramic phosphor element when exposed to monochromatic light having a wavelength of 450 nm.

A ceramic phosphor element may be used in a light-emitting device that produced warm white light. For example, such a light-emitting device may comprise a ceramic phosphor element described herein. The ceramic phosphor element may be disposed with respect to a light source so that a portion of any light emitted from the light source is absorbed by the ceramic phosphor element. The light from the light source that is absorbed by the ceramic phosphor element in turn results in emission of red-shifted light by the ceramic phosphor element. Thus, the ceramic phosphor element may be used to produce a more warm light than what would otherwise be produced by the light source.

A ceramic phosphor element may be prepared by sintering a precursor under a reducing atmosphere. The precursor material may be, e.g. a garnet powder, or may be precursor materials, such as garnet precursors. The precursor material may optionally be subject to a preliminary heating step, followed by a sintering step. After sintering, the material may be heated under reduced pressure, and then heated under a reducing atmosphere.

A precursor composition may be prepared for sintering. This may be done by combining compounds containing an element to be present in the ceramic phosphor element. For example, if a ceramic phosphor element contains Lu, Ce, Al, Mn, and Si, a precursor composition can be prepared by combining a compound containing Lu (such as $Lu_2O_3$) with a compound containing Ce (such as $CeO_2$), a compound containing Al (such as $Al_2O_3$), a compound containing Mn (such as $MnCO_3$), and a compound containing Si (such as $SiO_2$). The relative amounts of these compounds (referred to herein as "precursor compounds") can be adjusted so that the molar amounts of each metal element to be present in the ceramic correspond to the stoichiometry of the ceramic phosphor element. In some embodiments, $CaCO_3$ is not a precursor compound or Ca is not present in any of the precursor compounds.

Doped elements, such as Ce and Mn, can be provided as precursors added generally during synthesis. Doped elements can also be elements that are incorporated into the crystal lattice of the compound, for example as substituted within defined positions within the crystal lattice or otherwise interstitially included within the crystal.

The precursor compounds may be dispersed or dissolved in a solvent. The solvent may be water, an organic solvent, including a polar or a non-polar organic solvent such as ethanol, methanol, isopropyl alcohol, acetone, xylenes, cyclohexanone, toluene, and methyl ethyl ketone, etc. In some embodiments, the solvent is toluene.

In addition to the precursor compounds and any desired solvents, a precursor composition can comprise a sintering aid such as TEOS, $SiO_2$, silicates and fluorides such as tetraethoxysilane (TEOS), colloidal silica or a combination thereof; oxides and fluorides such as silicon oxide, lithium oxide, magnesium oxide, boron oxide, calcium fluoride, or a combination thereof. In some embodiments, the sintering aid can comprise silicon oxide. In some embodiments, the weight ratio of the sintering aid can vary from about 0.01 pph to about 5 pph. In some embodiments, the sintering aid can comprise a manganese carbonate (e.g. $MnCO_3$). In some embodiments, the $MnCO_3$ can provide $MnO_2$ in an air environment. In some embodiments, the sintering aid (e.g., $SiO_2$, $MnCO_3$ and/or mixtures thereof) can result in a melting point of the ceramic phosphor element of less than 1900° C.

A precursor composition can comprise a dispersant such as an ammonium salt, e.g., Flowlen; fish oil; long chain polymers; stearic acid; oxidized Menhaden Fish Oil (MFO); a dicarboxylic acid such as succinic acid, ethanedioic acid, propanedioic acid, pentanedioic acid, hexanedioic acid, heptanedioic acid, octanedioic acid, nonanedioic acid, decanedioic acid, o-phthalic acid, and p-phthalic acid; sorbitan monooleate; or a mixture thereof. Some embodiments preferably use oxidized MFO as a dispersant.

Some precursor compositions comprise a plasticizer, which include Plasticizers type 1 which can generally decrease the glass transition temperature (Tg), e.g. makes it more flexible, phthalates (n-butyl, dibutyl, dioctyl, butyl benzyl, missed esters, and dimethyl); and Plasticizers type 2, which can enable more flexible, more deformable layers, and perhaps reduce the amount of voids resulting from lamination, e.g., glycols (polyethylene; polyalkylene; polypropylene; triethylene; dipropylglycol benzoate).

Type 1 plasticizers can include butyl benzyl phthalate, dicarboxylic/tricarboxylic ester-based plasticizers such as phthalate-based plasticizers such as bis(2-ethylhexyl) phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, di-n-hexyl phthalate, or a combination thereof; adipate-based plasticizers such as bis(2-ethylhexyl)adipate, dimethyl adipate, monomethyl adipate, dioctyl adipate, or a combination thereof; sebacate-based plasticizers such as dibutyl sebacate, and maleate.

Type 2 plasticizers can include dibutyl maleate, diisobutyl maleate or a combination thereof, polyalkylene glycols such as polyethylene glycol, polypropylene glycol, or a combination thereof. Other plasticizers which may be used include benzoates; epoxidized vegetable oils; sulfonamides such as N-ethyl toluene sulfonamide, N-(2-hydroxypropyl)benzene sulfonamide, N-(n-butyl)benzene sulfonamide, organophosphates such as tricresyl phosphate, tributyl phosphate, glycols/polyethers such as triethylene glycol dihexanoate, tetraethylene glycol diheptanoate or a combination thereof; alkyl citrates such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, trimethyl citrate, alkyl sulphonic acid phenyl ester or a combination thereof; and/or PL001 (Polymer Innovations, Inc. Vista, Calif., USA), PL002 (Polymer Innovations, Inc. Vista, Calif., USA) and PL055 (Polymer Innovations, Inc. Vista, Calif., USA) or a combination thereof.

In some embodiments, a precursor composition can comprise a binder, such as an organic binder, e.g a vinyl polymer such as polyvinyl butyral (PVB), polyvinyl alcohol (PVA), polyvinyl chloride (PVC), polyvinyl acetate (PVAc), polyacrylonitrile, a mixture or a copolymer thereof; polyethyleneimine; poly methyl methacrylate (PMMA); vinyl chloride-acetate; or a combination thereof. In some embodiments, an acrylic water-based binder is used. In some embodiments, the acrylic water-based binder is comprises between about 20 wt % to about 40 wt % solid components. In some embodiments, the solid components comprise of a polymer. In some embodiments, the solid components comprise of a polymer and a plasticizer. In some embodiments, the polymer to plasticizer ratio is between about 3:1 to about 7:1, about 4:1 to about 6:1 or any combination thereof. In some embodiments, the acrylic water-based binder solution is comprised of about 35 wt % solid components where the solid components comprise an acrylic polymer to plasticizer with a mixing ratio of 4:1.

The precursor composition may be in the form of a green slurry, which may be cast into tape to create a green tape after the drying process. The tape casting process can be conducted in order to provide accurate thickness control of the sintered ceramic. In some embodiments, the slurry solution can then be cast on a releasing substrate (e.g., a silicone-coated Mylar® (polyethylene terephthalate) substrate) to form a tape. For example, the slurry solution may be cast onto a moving carrier using a doctor blade and dried to form a green tape. The thickness of the cast green tape can be adjusted by changing the gap between the comma blade and the moving carrier. In some embodiments, the cast green tape is dried at about 50° C. to about 80° C. by heating of the substrate. In some embodiments, the gap between the comma blade and the moving carrier is in the range of about 0.8 mm to about 30 µm. In some embodiments, the gap between the comma blade and the moving carrier is preferably between about 0.25 mm to about 50 µm. Meanwhile, the speed of the moving carrier can have a rate in the range of about 50-1500 mm/min, about 100-1000 mm/min, about 15-500 mm/min.

By adjusting the moving carrier speed and the gap between the comma blade and moving carrier, the tape is expected to have a thickness between about 20 µm and about 300 µm. The result of tape casting is a cast-slurry. In some embodiments, the cast-slurry is then exposed to heat ranging from 40° C. to about 90° C. for a time from about 5 minutes to 20 minutes in order to eliminate the solvent from the slurry. In some embodiments, multiple temperature settings are used to dry the cast slurry. In some embodiments, the cast slurry is dried at about 50° C. for time of about 5 min to about 10 min and then at about 80° C. for about 5 min to about 10 min. In some embodiments, the slurry is dried utilizing heat on the roll to roll tape casting machine. The result is in the form of a green tape.

In some embodiments, the method includes cutting the green tapes into desired shapes after drying and stacking them to yield a single laminate. In some embodiments, the total number of green sheets in stacking can range from about 2 to about 100 depending on the thickness of single green sheet and desired ceramic thickness. In some embodiments, the stack of green forms is then placed on the metal substrate, which made of metal, such as, anodized aluminum plate to yield a laminate assembly. In some embodiments, the resulting laminate assembly is then vacuum-bagged at room temperature and then compressed at above $T_g$ of polymeric binder material at isostatic pressure in the range of about 1 MPa to about 100 MPa in water. In some embodiments, the isostatic pressure is preferably about 30 to about 50 MPa. In some embodiments, the pressure and heat applied to laminate assembly for a duration ranging from about 1 minute to about 180 minutes, more preferably about 10 min, before pressure release and cool-down. The result is a laminated green form.

A precursor composition may undergo a preliminary heating to remove volatile materials or to otherwise remove materials that can be reacted to form gases below sintering temperatures, or for other purposes. In some embodiments the laminated green forms or green forms undergo debinding and Bisque firing in air atmosphere at temperatures that can range from about 300° C. to about 1100° C. for a timeframe appropriately ranging from about 30 minutes to about 5 hours in an oven depending on the thickness of the forms. In some embodiments, the green forms can be heated to the temperatures in the range of about 800° C. to about 1400° C. or about 1000° C. to about 1300° C. In some embodiments, the heating can occur at rate of about 0.01° C./min to about 10° C./min, about 0.05° C./min to about 5° C./min, or about 0.5° C./min to about 1.0° C./min. While not wanting to be limited by theory, debinding can provide the burning off of any binding additives such as binders, plasticizers, and dispersant in the green form prior to sintering. In addition, Bisque firing can impart material strength to the material in order to facilitate handling in subsequent manufacturing operations. In some embodiments, the mixture is debinded and Bisque fired at about 1200° C. in air for about 2 hours.

Typically sintering is carried out at a temperature that allows the particles to adhere to one another without melting, such as about 1550-1850° C., about 1600-1900° C., about 1625-1875° C., about 1650-1850° C., about 1650-1900° C., about 1675-1875° C., about 1700-1850° C., about 1650° C., about 1830° C., or any temperature in a range bounded by any of these values.

Optionally, sintering may be carried out in a reducing atmosphere, such as $H_2$ dispersed in $N_2$ (an $H_2/N_2$ atmosphere, e.g. 3% $H_2$ in $N_2$), a mixture of Argon gas (Ar) and hydrogen gas (an $Ar/H_2$ atmosphere, e.g. 3% $H_2$ in Ar). Some reducing atmospheres, e.g. 3% $H_2$ in $N_2$, may have slightly higher than atmospheric pressure (e.g. at least 1.01 atm, at least about 1.1 atm, at least about 1.2 atm, at least about 1.4 atm, up to about 1.5 atm or up to 2 atm). Alternatively, the atmosphere, including a reducing atmosphere such as 3% $H_2$ in $N_2$ may have reduced pressure or be under a vacuum.

Typically sintering is carried out a temperature that allows the particles to adhere to one another, e.g. for a time in a range of about 1-100 hours, about 2-36 hours, about 5 hours, about 8 hours, or any time in a range bounded by any of these values.

After sintering, a second heating may be carried out under a reduced pressure atmosphere containing oxygen. This may be helpful to replace oxygen in the garnet that was removed during the sintering process. Any suitable temperature may be employed, including a temperature at which lost oxygen in the garnet can be replenished. In some embodiments, the second heating may be carried out at a temperature in a range of about 1300-1500° C., about 1200-1600° C., about 1400° C., or at any temperature in a range bounded by any of these values. In some embodiments, the heating and cooling rates for the second heating, or for re-oxidation, are less than about 4.0° C./min.

The second heating may be carried out under reduced pressure, such as a vacuum pressure less than about 100 Torr, less than about 50 Torr, or about 20 Torr or less.

The second heating may be carried out for any suitable amount of time, such as a time sufficient to re-oxygenate the garnet. In some embodiments, the second heating is carried out for about 1-10 hours or about 2 hours.

After the second heating, the ceramic phosphor element may be further heated under a reducing atmosphere. This may be done to reduce the metals, such as to reduce any higher oxidation state of Mn, such as $Mn^{4+}$, back to $Mn^{2+}$, which may provide a red phosphor emission. This heating may be carried out at any suitable temperature, such as a temperature in a range of about 1200-1500° C., about 1300° C., or about 1400° C.

Heating in a reducing atmosphere may be done in a mixture of a reducing gas mixed or dispersed in an inert gas, such as $H_2$ dispersed in $N_2$ (an $H_2/N_2$ atmosphere, e.g. 3% $H_2$ in $N_2$), a mixture of Argon gas (Ar) and hydrogen gas (an $Ar/H_2$ atmosphere, e.g. 3% $H_2$ in Ar).

The second heating may be carried out for any suitable amount of time to carry out the desired reduction. In some embodiments, the second heating is carried out for about 1-10 hours, about 2 hours, or about 5 hours.

In some embodiments, the ceramic phosphor element can have an average emission, or an emissive maximum, in a green to red visible range, such as between about 500-700 nm, about 550-700 nm, or about 600-700 nm.

Figure 2:
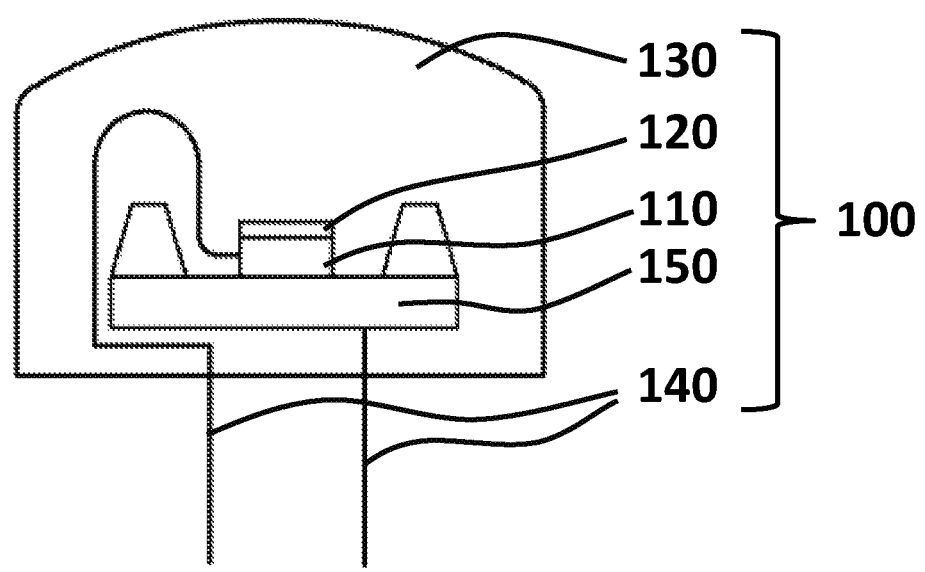
FIG. 2 is a schematic of an embodiment of a lighting device containing the ceramic phosphor element.

Some embodiments of a lighting device incorporating a ceramic phosphor element are represented by FIG. 2. In this figure, lighting device, 100, comprises a ceramic phosphor element, 120, and a light emitting diode (LED) device, 110. Electrical current is provided by the conducting wires, 140, through the conductive base, 150, to the LED in order to emit light. The LED, 110, can emit primary light which excites the phosphor in the ceramic element, 120, to generate complementary light which combines with the primary light to create a soft-white light before exiting the encapsulating resin, 130.

Embodiment 1

A ceramic phosphor element comprising a garnet phosphor composition described by a formula:

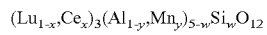

$(Lu_{1-x},Ce_x)_3(Al_{1-y},Mn_y)_{5-w}Si_wO_{12}$ wherein x is greater than 0 and less than about 0.2;
y is greater than 0 and less than 0.1; and
w is greater than 0 and less than 0.455.

Embodiment 2

The ceramic phosphor element of embodiment 1, wherein x is in a range of about 0.0001 to about 0.05 or to about 0.15.

Embodiment 3

The ceramic phosphor of embodiment 1 or 2, wherein y is in a range of about 0.001 to about 0.1.

Embodiment 4

The ceramic phosphor of embodiment 1, 2, or 3, wherein w is in a range of about 0.005 to about 0.2 or to about 0.3.

Embodiment 5

The ceramic phosphor element of embodiment 1, wherein the garnet phosphor composition is represented by the formula selected from the group consisting of
$Lu_{2.994}Ce_{0.006}Al_{4.936}Mn_{0.032}Si_{0.032}O_{12}$,
$Lu_{2.994}Ce_{0.006}Al_{4.900}Mn_{0.050}Si_{0.050}O_{12}$,
$Lu_{2.970}Ce_{0.030}Al_{4.900}Mn_{0.050}Si_{0.050}O_{12}$,
$Lu_{2.940}Ce_{0.060}Al_{4.900}Mn_{0.050}Si_{0.050}O_{12}$,
$Lu_{2.910}Ce_{0.090}Al_{4.900}Mn_{0.050}Si_{0.050}O_{12}$,
$Lu_{2.910}Ce_{0.090}Al_{4.852}Mn_{0.074}Si_{0.074}O_{12}$,
$Lu_{2.910}Ce_{0.090}Al_{4.708}Mn_{0.146}Si_{0.146}O_{12}$,
$Lu_{2.880}Ce_{0.120}Al_{4.9}Mn_{0.050}Si_{0.050}O_{12}$,
$Lu_{2.880}Ce_{0.120}Al_{4.804}Mn_{0.098}Si_{0.098}O_{12}$, and
$Lu_{2.850}Ce_{0.150}Al_{4.9}Mn_{0.050}Si_{0.050}O_{12}$.

Embodiment 6

The ceramic phosphor element of embodiment 1, 2, 3, 4, or 5, having a transmittance of at least about 70% for light having a wavelength of 800 nm.

Embodiment 7

The ceramic phosphor element of embodiment 1, 2, 3, 4, 5, or 6, having an internal quantum efficiency of at least 75% or at least 80% based upon the absorption of light by the ceramic phosphor element when exposed to monochromatic light having a wavelength of 450 nm.

Embodiment 8

The ceramic phosphor element of embodiment 1, 2, 3, 4, 5, 6, or 7, prepared by sintering a precursor under a reducing atmosphere.

Embodiment 9

The ceramic phosphor element of embodiment 8, wherein the sintering is carried out in an atmosphere containing $H_2$ dispersed in $N_2$.

Embodiment 10

The ceramic phosphor of embodiment 8, wherein the sintering is carried out at a temperature in a range of about 1550° C. or 1650° C. to 1900° C.

Embodiment 11

The light emitting device outputting a warm-white light, comprising the ceramic phosphor element of embodiment 1, 2, 3, 4, 5, 6, 7, 8, 9, or 10, disposed with respect to a light source so that a portion of any light emitted from the light source is absorbed by the ceramic phosphor element, and wherein absorption of light from the light source by the ceramic phosphor element results in emission of red-shifted light by the ceramic phosphor element.

Embodiment 12

A method for making a ceramic phosphor element comprising:
a. sintering a laminate at a temperature of about 1550° C. to about 1850° C.;
b. heating the laminate to a temperature of about 1300° C. to about 1500° C. under oxygen conditions at a near vacuum; and
c. further heating the laminate to a temperature of about 1200° C. to about 1500° C. under a reducing atmosphere;

wherein the laminate contains a precursor composition so that the ceramic phosphor element resulting from the method has a formula:

$(Lu_{1-x},Ce_x)_3(Al_{1-y},Mn_y)_{5-w}Si_wO_{12}$;

wherein x is greater than 0 and less than about 0.2; and
y is greater than 0 and less than 0.1; and
w is greater than 0 and less than 0.455.

EXAMPLES

It has been discovered that embodiments of the phosphor ceramic elements of Formula 1 or 2 described herein are suitable for lighting devices with use of blue and near-UV light sources. These benefits are further shown by the following examples, which are intended to be illustrative of the embodiments of the disclosure, but are not intended to limit the scope or underlying principles in any way.

The examples are summarized in Tables 1A, 1B, 1C, 1D and 2 which depict the variances in actual formulas, phosphor doping, and changes in the synthesis process. The experimental results including total transmittance (Tt %), internal quantum efficiency (IQE) and thermal quench for selected samples of Formula 2 are summarized in Table 2.

The total light transmittance (Tt %) of the obtained garnet phosphor ceramic plate plates were measured by high-sensitivity, multi-channel photo detector (MCPD 7000, Otsuka Electronics Co. Ltd., Osaka, Japan). To perform the measurements, first air without any sample was irradiated with continuous spectrum light from a 150 W halogen lamp source (MC2563, 150 W, Otsuka Electronics) and then measured to obtain reference transmission data. Next, each phosphor ceramic plate was then placed in the machine and then irradiated. The transmitted spectrum was acquired by the photo detector (MCPD) for each sample. Tt % at 800 nm wavelength of light was used as a quantitative measure of transparency of the obtained ceramics.

The measurements of internal quantum efficiency (IQE) of garnet phosphor ceramic plates made herein were also performed with another high sensitivity multi-channel photo detector system (MCPD 9800, Otsuka Electronics Inc., Osaka, Japan) connected with an integrate sphere (Gamma Scientific, San Diego Calif.) whose diameter is 300 mm. The blue LEDs used for excitation at 450 nm was a LUXEON LXML-PR01-0225 blue LED (Philips-Lumileds, San Jose, Calif., USA). First the blue LED, peak position of whose blue light is at 450 nm, was irradiated with 100 mA constant current, and the light spectrum B of the blue LED light was recorded. Then the small piece, whose nominal size is approximately 3.0 mm×3.0 mm, of the phosphor ceramic sample made herein was irradiated with the same blue LED at 100 mA constant current, and the light spectrum P, consisting of the emit phosphor light and the exciting blue LED light which was not absorbed by the phosphor ceramics, was recorded. The number of absorbed photons of blue LED light can be calculated from the area showing (B−P)>0, whereas that of emitted photons from the phosphor ceramics can be calculated from the area showing (B−P)<0. Finally, IQE of the phosphor ceramics was calculated from the equation shown in FIG. 1, which also schematically explained this IQE measurement. The other IQE measurement was also conducted with 410 nm near-UV LED in the same manner. The near-UV LED used for excitation at 410 nm was a LUXEON LHUV-0400 near-UV LED (Philips-Lumileds). The near-UV LEDs was also applied with a 100 mA current during the sample measurements. The calculated IQE values were summarized in Table 2.

Figure 4:
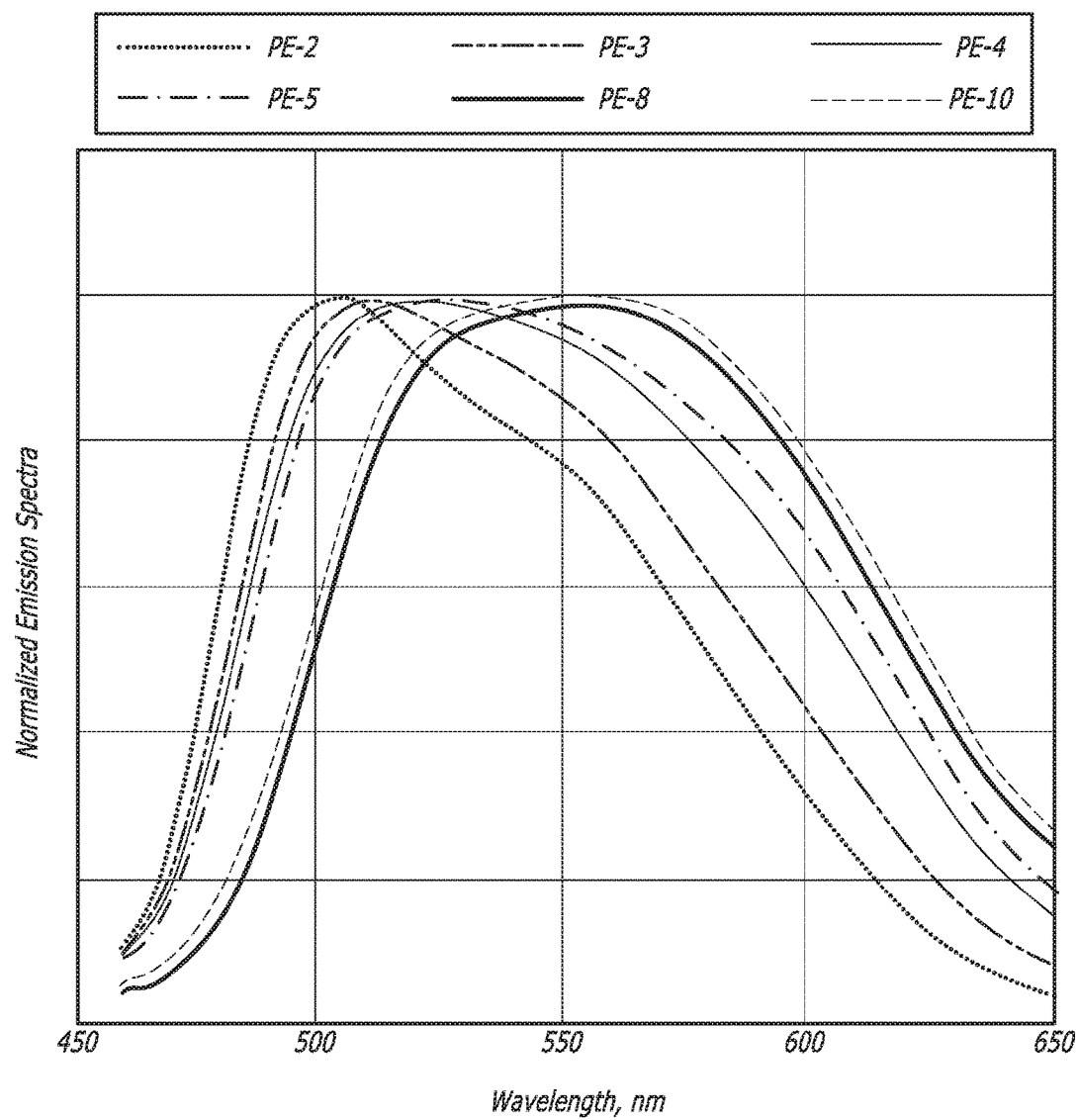
FIG. 4 is the normalized photoluminescence (PL) spectra of Phosphor Element 2 (PE-2) thru PE-10
Figure 5:
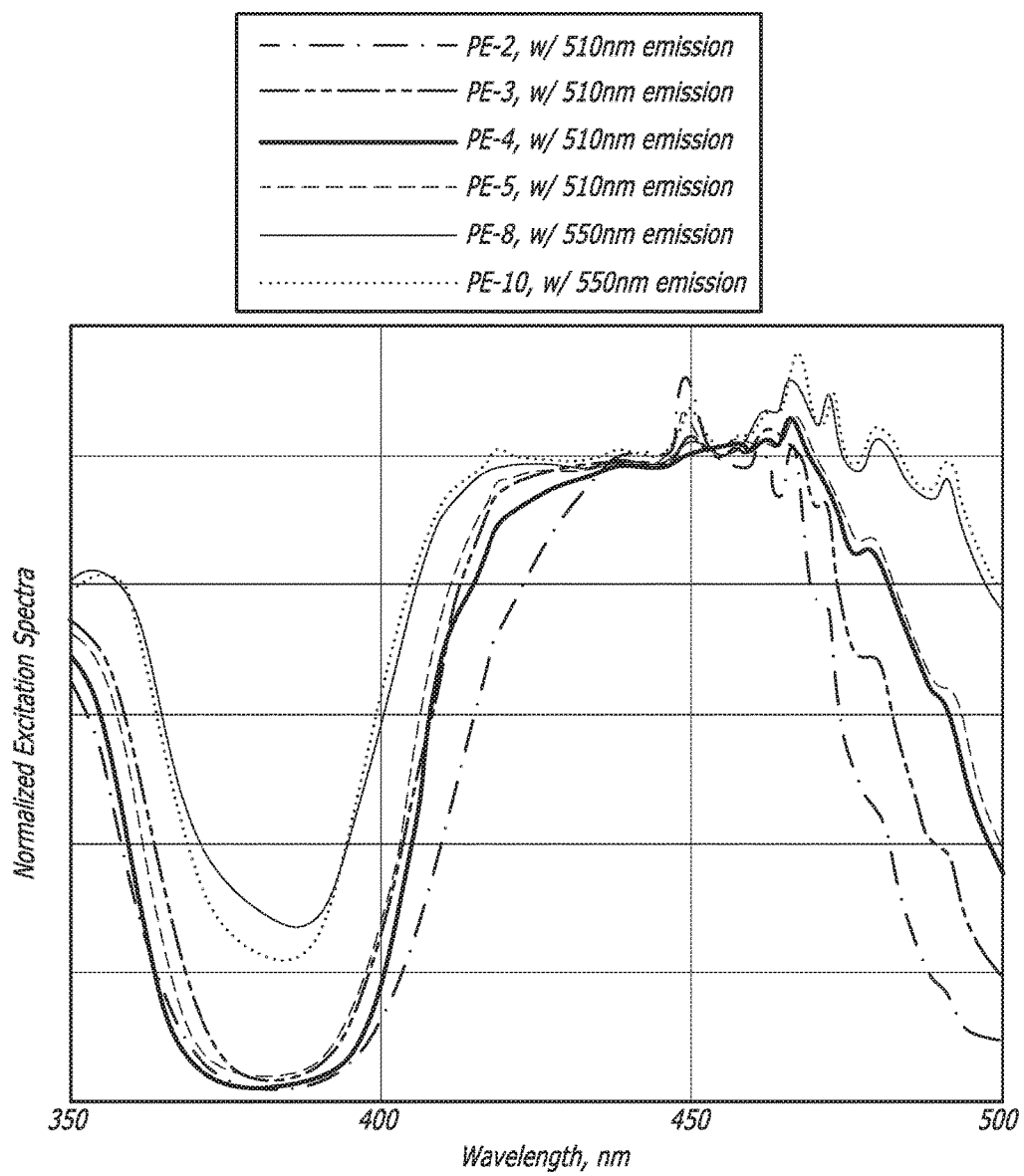
FIG. 5 is the normalized photoluminescence excitation (PLE) spectra for PE-2 thru PE-10

Photoluminescence emission (PL) and excitation (PLE) properties of garnet phosphor ceramics were measured with a Horiba Fluoromax 3 fluorescence spectrophotometer (Horiba Scientific Inc., Edison, N.J., USA) with a photo-multiplier tube operating at 400 V, and a 150 W Xe lamp used as the excitation lamp. PL spectra were collected with 450 nm excitation, whereas PLE spectra were collected with 510 nm emission. The results of PL and PLE spectra are shown in FIG. 4 and FIG. 5, respectively. These spectra were normalized by the light intensity of the peak position of the spectra. For both PL and PLE spectra, there was no clear difference between the samples measured herein and Ce-doped lutetium aluminum garnet (LuAG).

Figure 7:
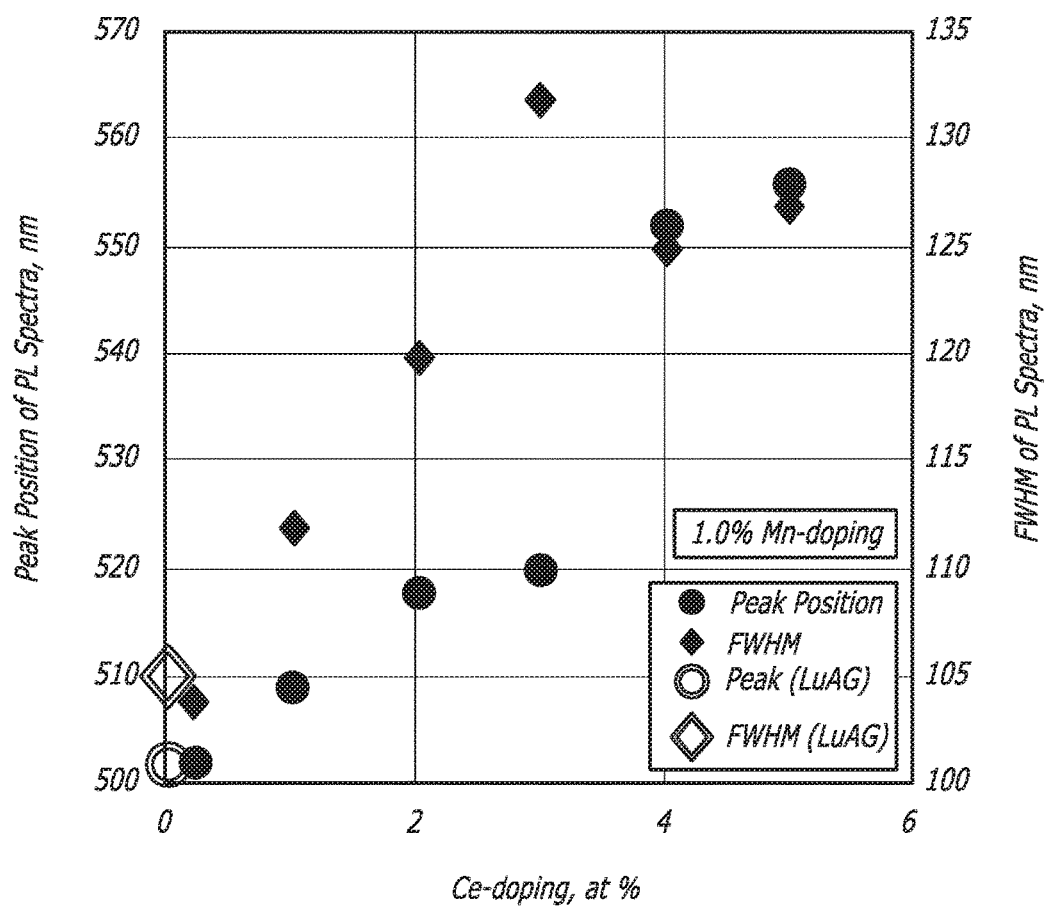
FIG. 7 shows the change of the peak position and FWHM of the PL spectra, shown in FIG. 4, with Mn-doping fixed at 1.0 at %.

The change of the peak positions and FWHM of the measured PL spectra of all samples were analyzed and summarized in Table 2. Especially, these analyzed results with fixed 1.0% Mn-doping were plotted with solid marks in FIG. 7. For reference, the results from the following Comparative Example 1 (Ce-doped LuAG) were also plotted with empty marks in FIG. 7 for reference. It was demonstrated that the peak position was shifted to longer wavelength side (to red emission) and the width of the emission spectra was also broadened with increasing Ce-doping.

Thermal quench property was measured while monitoring IQE change at different temperature, which was performed using high sensitivity multi channel photo detector system (MCPD 7000, Otsuka Electronics Inc., Osaka, Japan). The phosphor ceramics was heated on the hot plate from room temperature (~23° C.) to 175° C. IQE of the phosphor ceramics was measured by the set up which is in general useful for characterizing phosphor powders as described in U.S. Pat. No. 8,137,588 and Ohkubo, et al, "Absolute Fluorescent Quantum Efficiency of NBS Phosphor Standard Samples", J. Ilium. Engng. Inst. Jpn Vol 83, No. 2, 1999, p 87-93. The IQE of phosphor ceramics is the ratio of the number of photons generated from the phosphor to the number of photons of excitation light which are actually absorbed by the phosphor. At first, the phosphor ceramics was irradiated with a Xe lamp (150 W, L2274) at 450 nm wavelength after passing through a monochromator. An emission spectrum was acquired by using an integrating sphere, and the number (Qem) of photons of emitted light was calculated. Secondly, the irradiation spectrum of 405 nm wavelength after passing through a monochromator was collected with 50% reflectance standard target (SPECTRALON®, Labsphere Inc., North Sutton N.H.), and then the number (Qex) of photons of irradiated light in 450 nm wavelength was calculated. Thirdly, continuous spectrum light from a halogen lamp source (150 W, MC2563) was used for irradiation and applied on the 50% reflectance standard target to acquire the reflectance spectrum as a reference for the reflectance spectrum measurement. Finally, the continuous spectrum light from a halogen lamp source was applied on the silicate phosphor ceramics again and the reflectance spectrum of the silicate phosphor ceramics was recorded to calculate the number (Qref) of photons of reflected light in 405 nm wavelength. IQE of the phosphor ceramics was calculated from:

$$IQE = Qem/(Qex - Qref)$$

Figure 6:
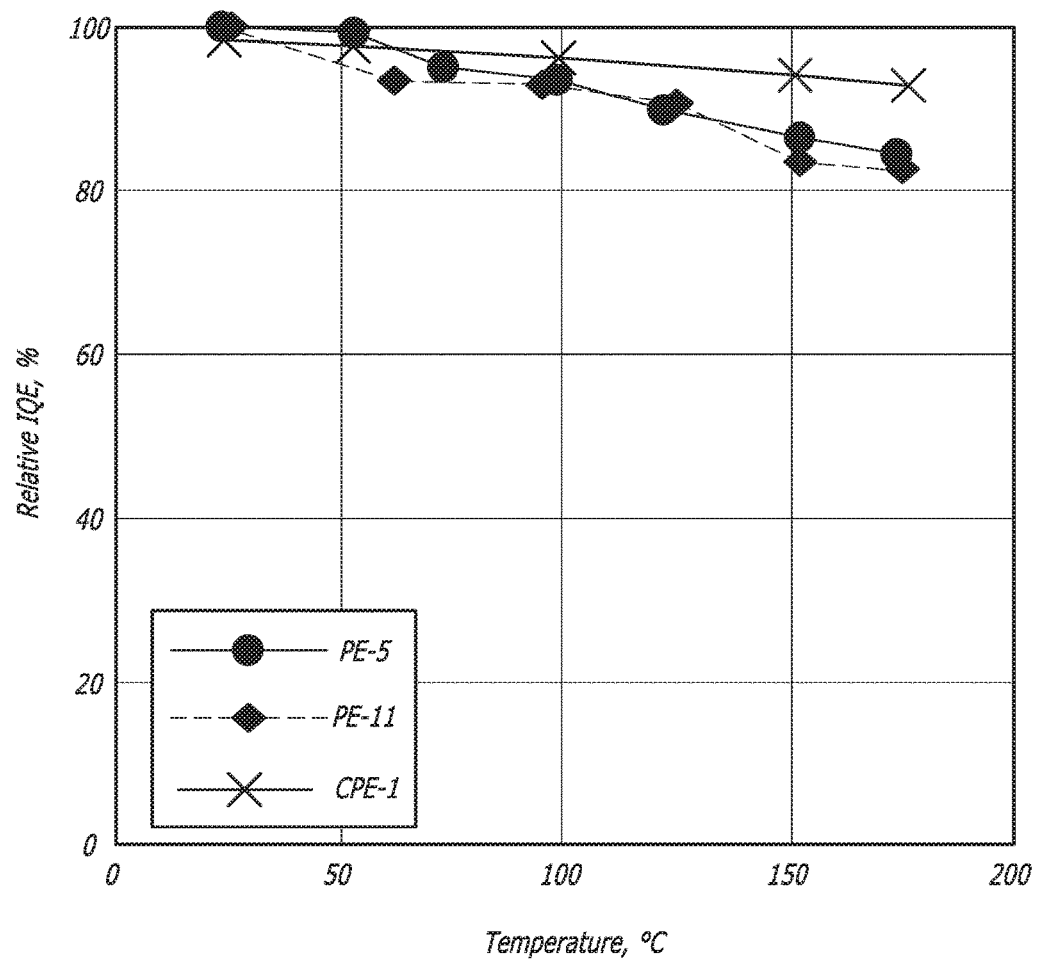
FIG. 6 is change of relative IQE of PE-5, PE-11 and CPE-1 at different temperatures to demonstrate thermal quenching.

The relative IQE value at each temperature as compared to that at room temperature was plot as shown in FIG. 6.

TABLE 1B

Actual Formulas of All Examples.

| Examples | Formula |
|---|---|
| Comp 1 | $Lu_{2.988} Ce_{0.012} Al_5 O_{12}$ |
| 1 | $Lu_{2.994} Ce_{0.006} Al_{4.936} Mn_{0.032} Si_{0.032} O_{12}$ |
| 2 | $Lu_{2.994} Ce_{0.006} Al_{4.900} Mn_{0.050} Si_{0.050} O_{12}$ |
| 3 | $Lu_{2.970} Ce_{0.030} Al_{4.900} Mn_{0.050} Si_{0.050} O_{12}$ |
| 4 | $Lu_{2.940} Ce_{0.060} Al_{4.900} Mn_{0.050} Si_{0.050} O_{12}$ |
| 5 | $Lu_{2.910} Ce_{0.090} Al_{4.900} Mn_{0.050} Si_{0.050} O_{12}$ |
| 6 | $Lu_{2.910} Ce_{0.090} Al_{4.852} Mn_{0.074} Si_{0.074} O_{12}$ |
| 7 | $Lu_{2.910} Ce_{0.090} Al_{4.708} Mn_{0.146} Si_{0.146} O_{12}$ |
| 8 | $Lu_{2.880} Ce_{0.120} Al_{4.900} Mn_{0.050} Si_{0.050} O_{12}$ |
| 9 | $Lu_{2.880} Ce_{0.120} Al_{4.804} Mn_{0.098} Si_{0.098} O_{12}$ |
| 10 | $Lu_{2.850} Ce_{0.150} Al_{4.900} Mn_{0.050} Si_{0.050} O_{12}$ |
| 11 | $Lu_{2.000} Ce_{0.005} Ce_{0.995} Al_{3.995} Mn_{0.005} Si_{1.000} O_{12}$ |
| 12 | $Lu_{2.000} Ce_{0.010} Ca_{0.990} Al_{3.990} Mn_{0.010} Si_{1.000} O_{12}$ |
| 13 | $Lu_{2.000} Ce_{0.020} Ca_{0.980} Al_{3.980} Mn_{0.020} Si_{1.000} O_{12}$ |
| Comp 2 | $Lu_{1.995} Ce_{0.005} Ca_{1.000} Al_{4.000} Si_{1.000} O_{12}$ |

TABLE 1A

Variances in Composition and Process Conditions for All Examples.

| Example | x (Ce-doping) | y (Mn-doping) | w | Solvent | Green lamination | Sintering gas | Sintering temp. (° C.) | Sintering time, (hrs) |
|---|---|---|---|---|---|---|---|---|
| Comp 1 | 0.0040 | 0 | 0 | Water | 53 μm × 3 | $N_2$/3% $H_2$ | 1830 | 5 |
| 1 | 0.0020 | 0.0065 | 0.032 | Water | 53 μm × 3 | $N_2$/3% $H_2$ | 1830 | 5 |
| 2 | 0.0020 | 0.010 | 0.050 | | | | 1830 | |
| 3 | 0.010 | 0.010 | 0.050 | | | | 1830 | |
| | | | | | | | 1750 | |
| | | | | | | | 1700 | |
| 4 | 0.020 | 0.010 | 0.050 | | | | 1830 | |
| | | | | | | | 1750 | |
| | | | | | | | 1700 | |
| 5 | 0.030 | 0.010 | 0.050 | | | | 1750 | |
| | | | | | | | 1700 | |
| | | | | | | | 1675 | |
| | | | | | | | 1650 | |
| 6 | 0.030 | 0.015 | 0.074 | | | | 1750 | |
| | | | | | | | 1700 | |
| | | | | | | | 1650 | |
| 7 | 0.030 | 0.030 | 0.146 | | | | 1750 | |
| | | | | | | | 1700 | |
| | | | | | | | 1675 | |
| | | | | | | | 1650 | |
| 8 | 0.040 | 0.010 | 0.050 | | | | 1700 | |
| | | | | | | | 1675 | |
| | | | | | | | 1650 | |
| 9 | 0.040 | 0.020 | 0.098 | | | | 1700 | |
| | | | | | | | 1675 | |
| | | | | | | | 1650 | |
| 10 | 0.050 | 0.010 | 0.050 | | | | 1700 | |
| | | | | | | | 1675 | |
| | | | | | | | 1650 | |
| 11 | 0.0025 | 0.00125 | 1.0 | Water + IPA | 53 μm × 3 | Vacuum | 1500 | 5 |
| | | | | | | | 1450 | |
| 12 | 0.0050 | 0.0025 | 1.0 | | | | 1450 | |
| 13 | 0.0100 | 0.0050 | 1.0 | | | | 1450 | |
| Comp 2 | 0.0025 | 0 | 1.0 | Water + IPA | 53 μm × 3 | Vacuum | 1500 | 5 |
| | | | | | | | 1450 | |

TABLE 1C

Amounts Used in Processes for Slurry Solutions of Examples 1-10 and Comparative Example 1

| Example | $Al_2O_3$ (g) | $Lu_2O_3$ (g) | $SiO_2$ (mg) | $CeO_2$ (mg) | $MnCO_3$ (mg) | acrylic polymer-first addition (g) | AMP[1] (mg) | TMDE[2] (mg) | Milli-Q water (g) | acrylic polymer-second addition (g) |
|---|---|---|---|---|---|---|---|---|---|---|
| Comp 1 | 18.55 | 43.25 | — | 150 | — | 8.55 | 777 | 78 | 16.15 | 7.50 |
| 1 | 18.27 | 43.25 | 140 | 75 | 167 | 8.55 | 779 | 78 | 16.15 | 7.55 |
| 2 | 18.14 | 43.21 | 209 | 75 | 400 | 8.55 | 780 | 78 | 16.15 | 7.57 |
| 3 | 18.14 | 42.89 | 216 | 375 | 413 | 8.55 | 781 | 78 | 16.15 | 7.59 |
| 4 | 18.15 | 42.50 | 216 | 750 | 413 | 8.55 | 782 | 78 | 16.15 | 7.61 |
| 5 | 18.17 | 42.10 | 216 | 1,130 | 414 | 8.55 | 783 | 78 | 16.15 | 7.63 |
| 6 | 17.96 | 42.04 | 322 | 1,120 | 617 | 8.55 | 784 | 78 | 16.15 | 7.66 |
| 7 | 17.36 | 14.87 | 633 | 1,120 | 1,210 | 8.55 | 784 | 79 | 16.15 | 7.66 |
| 8 | 18.18 | 41.70 | 217 | 1,500 | 414 | 8.55 | 784 | 78 | 16.15 | 7.64 |
| 9 | 17.77 | 41.59 | 428 | 1,500 | 818 | 8.55 | 787 | 79 | 16.15 | 7.71 |
| 10 | 18.20 | 41.30 | 217 | 1.88 | 415 | 8.55 | 785 | 78 | 16.15 | 7.66 |

[1]AMP: 2-amino-2-methyl-1-propanol
[2]TMDE: 2,4,7,9-tetramethyl-5-decyne-4,7-diol ethoxylate

TABLE 1D

Amounts Used in Processes for Garnet Precursor Powders of Examples 11-13 and Comparative Example 2

| Example | $Al_2O_3$ (g) | $Lu_2O_3$ (g) | $SiO_2$ (g) | $CaCO_3$ (g) | $CeO_2$ (mg) | $MnCO_3$ (mg) | G-700 (g) | $CH_3OH$ (g) |
|---|---|---|---|---|---|---|---|---|
| Comp. 2, | 34.02 | 66.23 | 10.03 | 16.70 | 144 | — | 2.4 | 150 |
| 11 | 33.94 | 66.32 | 10.0 | 16.6 | 144 | 96 | 2.4 | 150 |
| 12 | 33.80 | 66.13 | 9.99 | 16.47 | 287 | 191 | 2.4 | 150 |
| 13 | 33.53 | 65.75 | 9.93 | 16.21 | 575 | 380 | 2.4 | 150 |

TABLE 2

Summary of Experimental Data for All Samples Made

| | As-sintered | | | | Re-oxidized | | | | Annealed | | | | Emission spectra | |
|---|---|---|---|---|---|---|---|---|---|---|---|---|---|---|
| Example | Sinter temp. (° C.) | Tt % | IQE w/ 450 nm (%) | IQE w/ 410 nm (%) | Re-oxidation temp. (° C.) | Tt % | IQE w/ 450 nm (%) | IQE w/ 410 nm (%) | Thermal quench (%) | Anneal temp. (° C.) | Tt % | IQE w/ 450 nm (%) | IQE w/ 410 nm (%) | Thermal quench (%) | Peak position (nm) | FWHM (nm) |
| Comp 1 | 1830 | | | | 1400 | 86.0 | 97 | 96 | 95 | N/A | N/A | N/A | N/A | | 502 | 105 |
| 1 | 1830 | 84.4 | 82 | 58 | 1400 | 86.6 | 96 | 93 | | | | | | | 503 | 107 |
| 2 | 1830 | 84.1 | 82 | 65 | 1400 | 86.1 | 89 | 80 | | 1400 | 85.0 | 89 | 88 | | 502 | 104 |
| 3 | 1830 | 88.0 | 91 | | 1400 | 85.9 | 71 | | | 1400 | 86.8 | 76 | | | 509 | 112 |
| | 1750 | 87.2 | 84 | | | 87.5 | 67 | | | | 86.7 | 77 | | | | |
| | 1700 | 85.7 | 78 | | | 87.4 | 60 | | | | 88.0 | 82 | | | | |
| | | | | | 1300 | | | | | 1300 | 88.1 | 84 | | | | |
| 4 | 1830 | 78.1 | 92 | | 1400 | 67.6 | 74 | | | 1400 | 82.3 | 73 | | | 518 | 120 |
| | 1750 | 81.1 | 87 | | | 71.9 | 70 | | | | 85.1 | 80 | | | | |
| | 1700 | 86.4 | 83 | | | 84.2 | 66 | | | | 84.4 | 80 | | | | |
| | | | | | 1300 | | | | | 1300 | 83.8 | 81 | | | | |
| 5 | 1750 | 81.8 | 83 | | 1400 | 67.5 | 63 | | | 1400 | 75.7 | 76 | | | 520 | 132 |
| | 1700 | 85.1 | 82 | | | 81.0 | 64 | | | | 81.3 | 82 | | | | |
| | | | | | 1300 | 82.6 | | | | 1300 | 82.5 | 82 | | 87 | | |
| | 1675 | 83.9 | 77 | | | 78.1 | | | | | 80.2 | 82 | | | | |
| | 1650 | 83.4 | 82 | | | 79.0 | | | | | 79.5 | 83 | | | | |
| 6 | 1750 | 79.8 | 84 | | 1400 | 63.0 | 66 | | | 1400 | 81.2 | 80 | | | 515 | 132 |
| | 1700 | 81.1 | 76 | | | 74.7 | 71 | | | | 77.7 | 80 | | | | |
| | | | | | 1300 | 68.2 | | | | 1300 | 78.6 | 83 | | | | |
| | 1650 | 83.5 | 86 | | | 72.3 | | | | | 80.1 | 83 | | | | |

TABLE 2-continued

Summary of Experimental Data for All Samples Made

| | | As-sintered | | | Re-oxidized | | | | | Annealed | | | | | Emission spectra | |
|---|---|---|---|---|---|---|---|---|---|---|---|---|---|---|---|---|
| Example | Sinter temp. (° C.) | Tt % | IQE w/ 450 nm (%) | IQE w/ 410 nm (%) | Re-oxidation temp. (° C.) | Tt % | IQE w/ 450 nm (%) | IQE w/ 410 nm (%) | Thermal quench (%) | Anneal temp. (° C.) | Tt % | IQE w/ 450 nm (%) | IQE w/ 410 nm (%) | Thermal quench (%) | Peak position (nm) | FWHM (nm) |
| 7 | 1750 | 78.7 | 78 | | 1400 | 66.9 | 58 | | | 1400 | 79.1 | 81 | | | 514 | 133 |
| | 1700 | 84.9 | 81 | | | 70.0 | 61 | | | | 82.8 | 83 | | | | |
| | 1675 | 85.4 | 77 | | 1300 | 75.6 | | | | 1300 | 82.9 | 85 | | | | |
| | 1650 | 85.3 | 84 | | | 79.6 | | | | | 85.4 | 85 | | | | |
| 8 | 1700 | 78.5 | 69 | | 1300 | 77.5 | | | | 1300 | 78.3 | 74 | | | 552 | 125 |
| | 1675 | 76.7 | 74 | | | 76.1 | | | | | 76.9 | 64 | | | | |
| | 1650 | 81.6 | 69 | | | 82.7 | | | | | 82.9 | 64 | | | | |
| 9 | 1700 | 79.3 | 82 | | 1300 | 69.7 | | | | 1300 | 71.3 | 69 | | | 522 | 128 |
| | 1675 | 77.7 | 78 | | | 67.2 | | | | | 78.3 | 79 | | | | |
| | 1650 | 81.2 | 84 | | | 71.6 | | | | | 82.8 | 80 | | | | |
| 10 | 1700 | 68.2 | 63 | | 1300 | 73.1 | | | | 1300 | 73.5 | 73 | | | 556 | 127 |
| | 1675 | 74.5 | 66 | | | 74.4 | | | | | 78.8 | 68 | | | | |
| | 1650 | 80.1 | 67 | | | 81.0 | | | | | 80.2 | 63 | | | | |
| 11 | 1500 | 56.6 | 75 | 62 | N/A | N/A | N/A | N/A | N/A | 1400 | | | | | | |
| | 1450 | 57.0 | 72 | 60 | | N/A | N/A | N/A | N/A | | 62.4 | 72 | 72 | 84 | | |
| 12 | 1450 | 57.8 | 70 | 56 | | N/A | N/A | N/A | N/A | | 57.3 | 67 | 70 | | | |
| 13 | 1450 | 57.6 | 44 | 18 | | N/A | N/A | N/A | N/A | | 56.8 | 67 | 64 | | | |
| Comp 2 | 1500 | 54.4 | 73 | 60 | N/A | N/A | N/A | N/A | N/A | 1400 | | | | | | |
| | 1450 | 49.8 | 65 | 60 | | N/A | N/A | N/A | N/A | | 60.2 | 76 | 75 | | | |

Example 1

Figure 3:
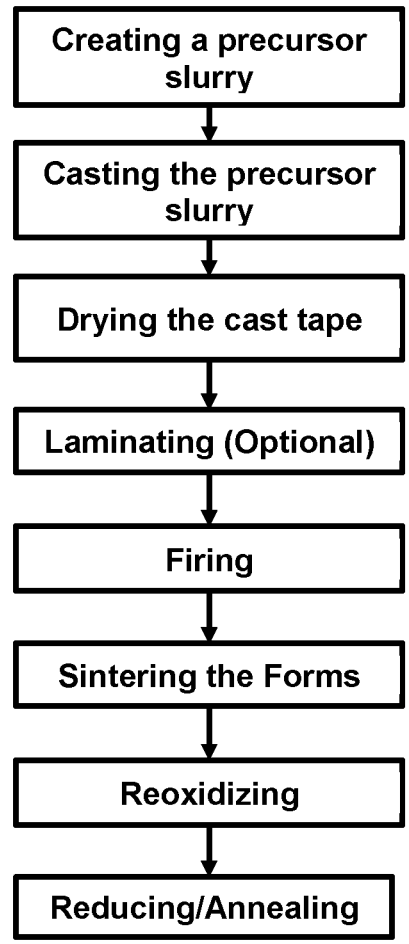
FIG. 3 is a schematic of one embodiment of the method for synthesizing the ceramic phosphor element

The overall process used in Example 1, is depicted in FIG. 3. In order to prepare 0.20 at % Ce- and 0.65 at % Mn-co-doped garnet phosphor plate while minimizing silicon without calcium, particles of $Al_2O_3$ (18.27 g), $Lu_2O_3$ (43.25 g), $SiO_2$ (140 mg), $CeO_2$ (75 mg), $MnCO_3$ (267 mg), aqueous acrylic polymer solution (8.55 g, 35 wt % solid content) as a main component of polymeric binder for final green sheet, 2-amino-2-methyl-1-propanol (AMP) (779 mg) as a plasticizer, 2,4,7,9-tetramethyl-5-decyne-4,7-diol ethoxylate (TMDE) (78 mg) as a defoamer for aqueous slurry, and Milli-Q water (16.15 g) were added to a 4 oz (0.12 L) polypropylene (PP) thick walled jar with inner diameter of 80 mm (Parkway Plastics Inc., Piscataway, N.J., USA) for aqueous slurry preparation. $ZrO_2$ milling media (180 g) ranging in size of about 6-10 mm diameter was added to the PP jar, and then the resulting mixture was ball milled. After ball-milling for 16 hours, additional aqueous acrylic polymer solution (7.55 g, 35 wt % solid content) was added to the milled solution in the PP jar, and the mixture was further ball-milled for about 4 hrs. The resulting aqueous slurry was filtered through a syringe-aided metal screen filter with pore size of about 0.05 mm to remove aggregated ceramic particles. A slurry solution of 95.11 g containing 60.0 vol % ceramic content was obtained.

The above slurry solution was then cast on 75 μm thick silicone-coated polyethylene terephthalate Mylar substrate film (Hansung Systems Inc., Seoul, South Korea) using an automated roll-to-roll tape caster with a comma blade at a cast rate of 200 mm/min. The blade gap of the film applicator was adjusted depending on the desired green sheet thickness. The resulting tape was about 53 microns thick. The cast tape was dried at 50° C. and 80° C. at two different heat zones in the automated roll-to-roll tape caster with a length of 1.5 m each to form a green sheet.

The above dried green sheet was cut to be about 100 mm×100 mm using a razor blade. Next, samples were constructed to consist 3 layers of 53 micron thick green sheet layers. Laminates were assembled on an anodized aluminum plate, and this assembly was vacuum-bagged before isostatic pressing. This assembly was laminated using a cold isostatic press (CIP) at 42 MPa at 85° C. for 10 min. using an ILS-66 isostatic lamination press (Keko Equipment, užemberk, Slovenia). An approximately 150-micron thick, single green laminate was then obtained. The green laminates were then laser-cut to the size of 20 mm×20 mm cubic shape using a VLS 2.30 laser engraving and cutting system with a 25 W $CO_2$ laser (Universal Laser Systems, Scottsdale, Ariz., USA) for debinding and Bisque-firing.

The polymeric binder was removed from the above laminated samples. The laminated samples were sandwiched between $Al_2O_3$ porous cover plates (ESL ElectroScience, King of Prussia, Pa., USA) with 40% nominal porosity, in order to avoid the warping, cambering and bending of the laminated samples during the debinding process. Alternatively, a plurality of green laminate samples can be stacked between porous $Al_2O_3$ cover plates. The laminated samples were then heated to about 1200° C. for about 2 hrs in air using a ST-1700C-445 box furnace (SentroTech Corporation, Brea, Ohio, USA) for debinding and Bisque-firing. The heating and cooling rates were about <0.7° C./min and <4.0° C./min, respectively. The debinded/Bisque-fired samples were then fully sintered at 1830° C. for about 5 hours, in a $N_2$ with 3% $H_2$ atmosphere at slightly higher than atmospheric pressure, using a high-temperature furnace made of tungsten and molybdenum. The heating rate of this sintering process was about 16.7° C./min (for T≤400° C.), then about 8.0° C./min (400° C.<T≤1000° C.), then about 2.5° C. (1000° C.<T≤1400° C.), then about 1.7° C./min (1400° C.<T≤1500° C.), and then about 0.75° C./min (T>1500° C.). The cooling rate was about 8.0° C./min in order to minimize cracking during sintering. This process resulted in ceramics slightly brown in color, believed in part due to oxygen vacancies in ceramic host crystal. A reoxidation process was then performed at 1400° C. for about 2 hours under low vacuum pressure of about 20 Torr, at a heating and cooling rate of about less than 4.0° C./min using GSL-1700X-80 bench-top single heat zone tube furnace (MTI Corporation, Richmond, Calif. USA). This process resulted in a 0.20 at % Ce- and 0.65 at % Mn-codoped garnet phosphor plate with minimized silicon without calcium, PE-1.

For Phosphor Element 1 (PE-1), Tt % and IQE were measured and are listed in Table 2. For both PL and PLE spectra, there was no clear difference between PE-1 and a Ce-doped lutetium aluminum garnet (LuAG) (CPE-1). The results of PL and PLE spectra are shown in FIG. 4 and FIG. 5 respectively.

Example 2

In order to prepare a 0.20 at % Ce- and 1.0 at % Mn-co-doped garnet phosphor plate while minimizing silicon without calcium, samples in Example 2 were prepared using the same method as that in Example 1 except the amounts of the constituents were varied (Table 1C) and additional reduction/annealing process was performed to generate PE-2. Upon reoxidation, it was likely that the Mn ionic state was $Mn^{4+}$ due to the presence of oxygen in low vacuum. Therefore, in order to regain the ionic charge of $Mn^{2+}$, a reduction/annealing process was then additionally performed in the same tube furnace at 1400° C. for about 5 hours in a $N_2$/3% $H_2$ gas atmosphere to result in a phosphor ceramic element.2 (PE-2).

For Phosphor Element 2 (PE-2), Tt % and IQE at various stages (as-sintered, reoxidized and reduced/annealed) were measured and their results are listed in Table 2. The peak position and full-width-at-half-maximum (FWHM) of the PL spectrum were also analyzed and summarized in Table 2. For both PL and PLE spectra, there was no clear difference between PE-2 and Ce-doped lutetium aluminum garnet (LuAG) (CPE-1).

Example 3

In order to prepare 1.0 at % Ce- and 1.0 at % Mn-co-doped garnet phosphor plate while minimizing silicon without calcium, the samples in Example 3 were prepared by the same method as that in Example 2, except that the amounts of the constituents (Table 1C) and the sintering temperatures were varied (1700° C.-1830° C.). resulting in a 1.0 at % Ce and 1.0 at % Mn co-doped garnet phosphor plate with minimized silicon without calcium, PE-3.

For Phosphor Element 3 (PE-3), both Tt % and IQE were measured and are listed in Table 2. As shown in FIG. 4, the red emission of PE-3 at 630 nm wavelength was enhanced as compared to that of PE-2 indicating that the phosphors' red emission enhancement can be adjusted by changing Ce-doping (and Mn-doping as demonstrated in the examples below). It was also observed that the PLE spectrum of PE-3 was broadened as compared with that of PE-2 as shown in FIG. 5.

Example 4

In order to prepare 2.0 at % Ce- and 1.0 at % Mn-codoped garnet phosphor plate while minimizing silicon without calcium, the samples in Example 4 were prepared by the same method as that in Example 3, except that the amounts of the constituents were varied as shown in Table 1C, and the re-oxidation and reducing/annealing temperatures were varied (between 1300° C. and 1400° C.) resulting in a 2.0 at % Ce- and 1.0 at % Mn-codoped garnet phosphor plate with minimized silicon without calcium, PE-4.

For Phosphor Element 4 (PE-4), Tt % and IQE were measured and are listed in Table 2.

PL and PLE spectra were also measured. As shown in FIG. 4, the red emission of PE-4 at 630 nm wavelength was further enhanced as compared to that of PE-3 and PE-2. This further supports the observation that the phosphors' red emission enhancement can be adjusted by changing Ce-doping. It was also observed that the PLE spectrum of PE-4 was also broadened as compared with that of PE-3 as shown in FIG. 5.

Example 5

In order to prepare 3.0 at % Ce- and 1.0 at % Mn-codoped garnet phosphor plate while minimizing silicon without calcium, the samples in Example 5 were prepared by the same method as that in Example 4, with the exception that the constituents (Table 1C) and the sintering temperature were varied. The sintering temperate was in the range between 1650° C. and 1750° C., instead of 1830° C.

This process resulted in a 3.0 at % Ce- and 1.0 at % Mn-codoped garnet phosphor plate with minimized silicon without calcium, PE-5.

For Phosphor Element 5 (PE-5), Tt % and IQE were measured and are listed in Table 2. PL and PLE spectra were also measured. For PE-5, the red emission at 630 nm wavelength was further enhanced when compared with that of PE-4 as shown in FIG. 4. The PLE spectrum of PE-5 was substantially broadened as compared with that of PE-4 as shown in FIG. 5.

For Phosphor Element 5 (PE-5), thermal quench property was measured while monitoring IQE change at different temperature. The relative IQE value at 150° C. as compared to that at room temperature was 87%, and also shown as thermal quench property in Table 2.

Example 6

In order to prepare 3.0 at % Ce- and 1.5 at % Mn-codoped garnet phosphor plate while minimizing silicon without calcium, the samples in Example 6 were prepared by the same method as that in Example 5, with the exception that the constituents (Table 1C) and the sintering temperature were varied. The sintering temperate was in the range of 1650° C.-1750° C.

This process resulted in a 3.0 at % Ce- and 1.5 at % Mn-codoped garnet phosphor plate with minimized silicon without calcium, PE-6.

Tt % and IQE are measured and listed in Table 2. PL and PLE spectra were also measured. The results of PL and PLE spectra of PE-6 were substantially comparable with that of PE-5.

Example 7

In order to prepare 3.0 at % Ce- and 3.0 at % Mn-codoped garnet phosphor plate while minimizing silicon without calcium, the samples in Example 7 were prepared by the same method as that in Example 5, with the exception that the constituents (Table 1C) and the sintering temperature were varied. The sintering temperate was in the range of 1650° C.-1750° C.

This process resulted in a 3.0 at % Ce- and 3.0 at % Mn-codoped garnet phosphor plate with minimized silicon without calcium, PE-7.

Tt % and IQE were measured i and are listed in Table 2. PL and PLE spectra were also measured. The results of PL and PLE spectra of PE-7 were substantially comparable with the spectra of PE-5.

Example 8

In order to prepare 4.0 at % Ce- and 1.0 at % Mn-co-doped garnet phosphor plate while minimizing silicon without calcium, the samples in Example 8 were prepared by the same method as that in Example 5, with the exception that the constituents (Table 1C) and the sintering temperature were varied. The sintering temperate was in the range between 1650° C. and 1700° C. In addition, the reoxidation and annealing temperatures were 1300° C. This process resulted in a 4.0 at % Ce- and 1.0 at % Mn-codoped garnet phosphor plate with minimized silicon without calcium, PE-8.

For Phosphor Element 8 (PE-8), Tt % and IQE were measured and are listed in Table 2. PL and PLE spectra were also measured except that PLE spectrum were collected with 550 nm emission due to red-shifted spectra. The red emission at 630 nm wavelength was further enhanced when compared with PE-5 as shown in FIG. 4. The PLE spectrum of PE-8 was broadened as compared with that of PE-5.

Example 9

In order to prepare 4.0 at % Ce- and 2.0 at % Mn-codoped garnet phosphor plate while minimizing silicon without calcium, the samples in Example 9 were prepared by the same method as that in Example 8, with the exception that the constituents were varied as indicated in Table 1C. The process resulted in a 4.0 at % Ce- and 2.0 at % Mn-codoped garnet phosphor plate with minimized silicon without calcium, PE-9.

For Phosphor Element 9 (PE-9), Tt % and IQE were measured and are listed in Table 2. PL and PLE spectra were measured as well. The results of PL and PLE spectra of PE-9 were substantially comparable with that of PE-8

Example 10

In order to prepare 5.0 at % Ce- and 1.0 at % Mn-codoped garnet phosphor plate while minimizing silicon without calcium, the samples in Example 10 were prepared by the same method as that in Example 8, with the exception that the constituents were varied as indicated in Table 1C. The process resulted in a 5.0 at % Ce- and 1.0 at % Mn-codoped garnet phosphor plate with minimized silicon without calcium, PE-10.

For Phosphor Element 10 (PE-10), Tt % and IQE were measured and are listed in Table 2. The results of both PL and PLE spectra of PE-10 were substantially comparable with that of PE-8

Comparative Example 1

In order to prepare a 0.40 at % Ce-doped garnet phosphor plate, which is also known to be lutetium aluminium garnet (LuAG), the samples were prepared by the same method as that in Example 1, except that the amounts of the constituents were varied as shown in Table 1A. This process resulted in a 0.40 at % Ce-doped garnet phosphor plate without silicon or calcium, CPE-1.

For the Comparative Phosphor Element 1 (CPE-1), the Tt % and IQE are measured and listed in Table 2. The thermal quenching property was also measured while monitoring IQE change at different temperature. The relative IQE value at 150° C. as compared to room temperature was 95%, shown as the thermal quench property in Table 2.

Example 11

In order to prepare 0.25 at % Ce- and 0.125 at % Mn-codoped garnet phosphor plate with silicon and calcium, Phosphor Element 11 (PE-11), first a garnet precursor powder (Intermediate Compound 11, IC-11) was synthesized. The particles of 33.94 g of $Al_2O_3$, 66.32 g of $Lu_2O_3$, 10.01 g of $SiO_2$, 16.60 g of $CaCO_3$, 144 mg of $CeO_2$, 96 mg of $MnCO_3$, 2.4 g of G-700 dispersant (Kyoeisha Chemical Company, Ltd., Osaka, Japan), and 150 g methanol were added to a 4 oz (0.12 L) polypropylene (PP) thick walled jar with inner diameter of 80 mm (Parkway Plastics Inc). The resulting mixture was ball-milled with 750 g of $ZrO_2$ milling media with about 10-15 mm diameter for 16 hours. The mixture was then dried at 80° C. in air for more than 16 hours, and the dried mixture was gently ground with agate mortar and pestle. The mixed powder was then calcined in air at 1000° C. for 2 hours to obtain a calcined garnet precursor powder (IC-11) with the desired surface area in the range of about 1.0-3.0 m2/g t.

Next, a green sheet was prepared. The above garnet phosphor precursor powder (IC-11, 47.81 g), 1.43 g of G-700 dispersant (comprising 3.0 wt.pph. of the garnet precursor powder) (Kyoeisha, Japan), 2.40 g of aqueous acrylic polymer solution (35 wt % solid content), 744 mg of PL005 plasticizer (Polymer Innovations, Vista Calif.), 74 mg of 2,4,7,9-tetramethyl-5-decyne-4,7-diol ethoxylate as a defoamer, and 18.00 g of isopropanol (IPA) (Alrich) were added to a 4 oz (0.12 L) polypropylene (PP) thick walled jar with inner diameter of 80 mm (Parkway Plastics). Then 180 g of $ZrO_2$ milling media with diameter of about 6-10 mm was added to the PP jar. After ball-milling for 16 hours, an additional 12.97 g of the same aqueous acrylic polymer solution (35 wt %) was added to the milled solution of ceramic particles in the PP jar, and the mixture was further ball-milled for 4 hrs. The resulting aqueous slurry was filtered through a syringe-aided metal screen filter with pore size of 0.05 mm to remove aggregated ceramic particles. Finally 80.00 g of slurry solution was obtained for tape casting process.

Tape casting was conducted the same manner as that in Example 1. The resulting ceramic content of the green sheet thus obtained is 60.0 vol % after evaporating water and isopropanol, assuming that the density of the garnet phosphor was 5.4 g/cc, whereas the density of the polymeric binder was 1.05 g/cc. The lamination, the debinding, and the Bisque-firing processes were also the same as that in Example 1. The debinded/Bisque-fired samples were then sintered at a temperature of either 1450° C. or 1500° C. for about 5 hours in vacuum of 20 Torr at a heating and cooling rate of <4.0° C./min using GSL-1700X-80 bench-top single heat zone tube furnace (MTI Corporation). The samples were then further annealed in the same oven at 1400° C. for 5 hours in $N_2/H_2$ atmosphere using the same tube furnace. This process resulted in a 0.25 at % Ce- and 0.125 at % Mn-codoped garnet phosphor plate with silicon and calcium, the Phosphor Element 11 (PE-11).

Figure 8:
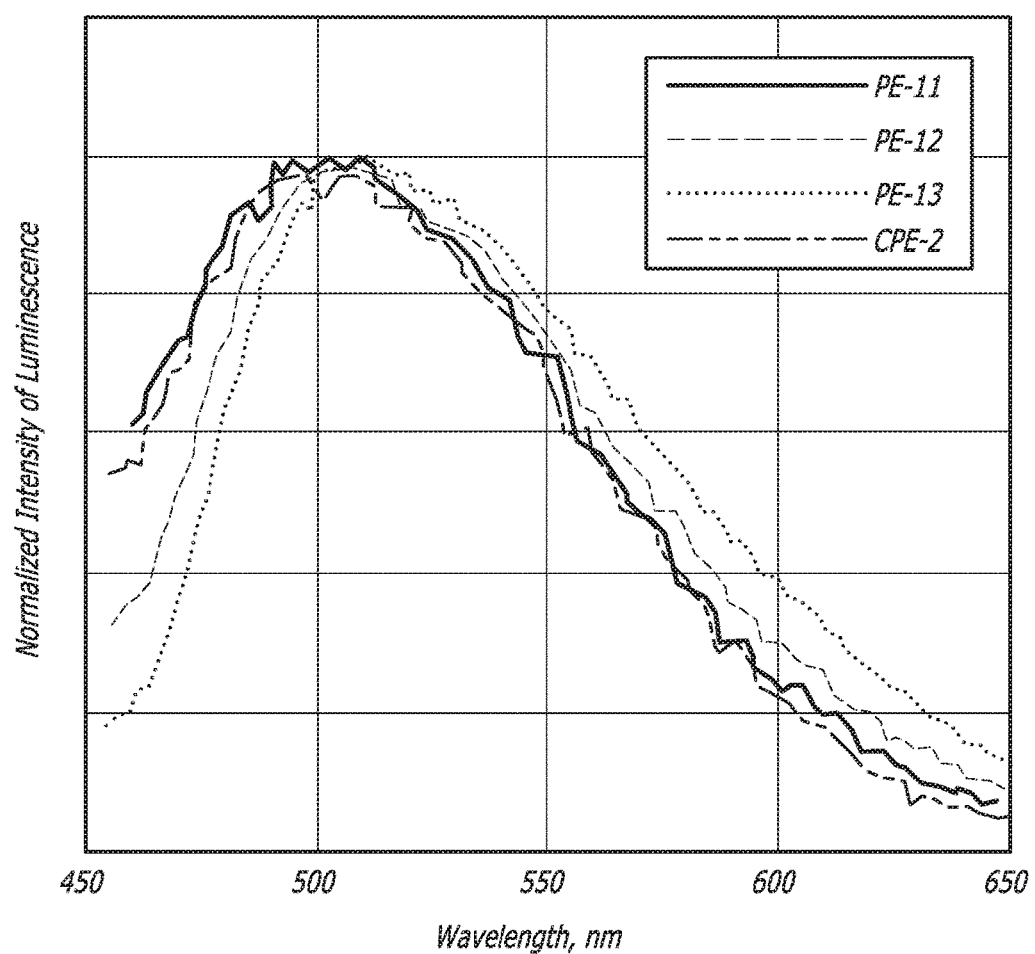
FIG. 8 is the normalized PL spectra for PE-11 thru PE-13 and Comparative Phosphor Element 2 (CEP-2).

For Phosphor Element 11, Tt % and IQE were measured and are listed in Table 2. The Tt % of PE-11 was significantly lower than that of PE-1 through PE-4 due to the higher amount of $SiO_2$. A Normalized emission spectrum of PE-11 was collected during the IQE measurement with 410 nm excitation as shown in FIG. 8.

For Phosphor Element 11, thermal quench property was measured while monitoring IQE change at different temperature. The relative IQE value at 150° C. as compared to room temperature was 84%, and shown as thermal quench property in Table 2.

Example 12

In order to prepare 0.50 at % Ce- and 0.25 at % Mn-codoped garnet phosphor plate with silicon and calcium, the Phosphor Element 12 (PE-12), the samples were prepared by the same method as that in Example 11 with the exception of a different garnet phosphor powder (IC-12) consisting of different amounts of contents (Table 1 D) was used instead of IC-11.

This process resulted in a 0.50 at % Ce- and 0.25 at % Mn-codoped garnet phosphor plate with silicon and calcium, the Phosphor Element 12 (PE-12).

For Phosphor Element-12, Tt % and IQE were measured and listed in Table 2. The Tt % for PE-12 was lower than that of PE-1 through PE-4. Normalized emission spectrum of PE-12 was collected during the IQE measurement with 410 nm excitation. The red emission of PE-12 at 630 nm wavelength was slightly enhanced as compared with that of PE-8 as shown in FIG. 8.

Example 13

In order to prepare 1.0 at % Ce- and 0.50 at % Mn-codoped garnet phosphor plate with silicon and calcium, the Phosphor Element 13 (PE-13), the samples were prepared by the same method as that in Example 12 with the exception a different garnet phosphor powder (IC-13) consisting of different contents (Table 1 D) was used instead of IC-12.

This process resulted in a 1.0 at % Ce- and 0.50 at % Mn-codoped garnet phosphor plate with silicon and calcium, the Phosphor Element 13 (PE-13).

For Phosphor Element-13, Tt % and IQE were measured and listed in Table 2. The Tt % for PE-13 was lower than that of PE-1 through PE-4. Normalized emission spectrum of PE-13 was collected during the IQE measurement with 410 nm excitation. The red emission of PE-13 at 630 nm wavelength was enhanced as compared with PE-12 (FIG. 8) suggesting that the intensity of the red emission can be adjusted by both Ce-doping and Mn-doping amounts.

Comparative Example 2

The Comparative Phosphor Element 2 (CPE-2), a 0.25 at % Ce-doped garnet phosphor plate with silicon and calcium, was prepared by the same method as that in Example 11 with the exception of a different garnet phosphor powder (IC-2) consisting of different contents (Table 1D) being used instead of IC-11. The maximum sintering temperature was either about 1500° C. or about 1450° C.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A method for making a ceramic phosphor element comprising:
    (a) sintering a laminate at a temperature of about 1550° C. to about 1850° C.;
    (b) heating the laminate to a temperature of about 1300° C. to about 1500° C. under oxygen conditions at a near vacuum; and
    (c) further heating the laminate to a temperature of about 1200° C. to about 1500° C. under a reducing atmosphere;
    wherein the laminate contains a precursor composition so that the ceramic phosphor element resulting from the method has a formula:

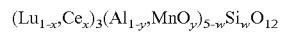

$(Lu_{1-x},Ce_x)_3(Al_{1-y},MnO_y)_{5-w}Si_wO_{12}$ wherein x is greater than 0 and less than about 0.2; and
    y is greater than 0 and less than 0.1; and
    w is greater than 0 and less than 0.455.

2. The method of claim 1, wherein x is in a range of about 0.0001 to about 0.15.

3. The method of claim 1, wherein y is in a range of about 0.001 to about 0.1.

4. The method of claim 1, wherein w is in a range of about 0.005 to about 0.3.

5. The method of claim 1, wherein the resulting phosphor element is represented by the formula selected from the group consisting of $Lu_{2.994}Ce_{0.006}Al_{4.936}Mn_{0.032}Si_{0.032}O_{12}$, $Lu_{2.994}Ce_{0.006}Al_{4.900}Mn_{0.050}Si_{0.050}O_{12}$, $Lu_{2.970}Ce_{0.030}Al_{4.900}Mn_{0.050}Si_{0.050}O_{12}$, $Lu_{2.940}Ce_{0.060}Al_{4.900}Mn_{0.050}Si_{0.050}O_{12}$, $Lu_{2.910}Ce_{0.090}Al_{4.900}Mn_{0.050}Si_{0.050}O_{12}$, $Lu_{2.910}Ce_{0.090}Al_{4.852}Mn_{0.074}Si_{0.074}O_{12}$, $Lu_{2.910}Ce_{0.090}Al_{4.708}Mn_{0.146}Si_{0.146}O_{12}$, $Lu_{2.880}Ce_{0.120}Al_{4.9}Mn_{0.050}Si_{0.050}O_{12}$, $Lu_{2.880}Ce_{0.120}Al_{4.804}Mn_{0.098}Si_{0.098}O_{12}$, and $Lu_{2.850}Ce_{0.150}Al_{4.9}Mn_{0.050}Si_{0.050}O_{12}$.

6. The method of claim 1, wherein the resulting ceramic phosphor element has a transmittance of at least about 70% for light having a wavelength of 800 nm.

7. The method of claim 1, wherein the resulting ceramic phosphor element has an internal quantum efficiency of at least 75% based upon the absorption of light by the ceramic phosphor element when exposed to monochromatic light having a wavelength of 450 nm.

8. The method of claim 1, wherein the sintering is carried out in an atmosphere containing $H_2$ dispersed in $N_2$.

\* \* \* \* \*